United States Patent [19]
Doan et al.

[11] Patent Number: 5,240,871
[45] Date of Patent: Aug. 31, 1993

[54] CORRUGATED STORAGE CONTACT CAPACITOR AND METHOD FOR FORMING A CORRUGATED STORAGE CONTACT CAPACITOR

[75] Inventors: Trung T. Doan; David A. Cathey, both of Boise, Id.

[73] Assignee: Micron Technology, Inc., Boise, Id.

[21] Appl. No.: 755,985

[22] Filed: Sep. 6, 1991

[51] Int. Cl.⁵ .................... H01L 21/70; H01L 21/265
[52] U.S. Cl. ........................ 437/47; 437/52; 437/60; 437/919
[58] Field of Search ............ 437/47, 49, 52, 60, 437/919; 357/23.6; 365/185; 257/301–316

[56] References Cited

U.S. PATENT DOCUMENTS

| | | | |
|---|---|---|---|
| 4,366,618 | 1/1983 | Ogura et al. | 437/48 |
| 4,686,000 | 8/1987 | Heath | 437/235 |
| 4,974,040 | 11/1990 | Tagachi et al. | 357/23.6 |
| 5,022,958 | 6/1991 | Favreau et al. | 156/643 |
| 5,126,280 | 6/1992 | Chan et al. | 437/52 |
| 5,135,883 | 8/1992 | Bae et al. | 437/228 |
| 5,142,639 | 8/1992 | Kohyama et al. | 357/23.6 |

Primary Examiner—Olik Chaudhuri
Assistant Examiner—Loc Q. Trinh
Attorney, Agent, or Firm—Susan B. Collier

[57] ABSTRACT

A dynamic random access memory (DRAM) cell having a corrugated storage contact capacitor for enhancing capacitance. A noncritical alignment is effected between the substrate contact area and the lower capacitor plate by using an etch stop layer to protect wordlines, field-effect transistors (FETs), and field oxide regions during the patterning and etching of storage capacitor regions. The corrugated storage contact capacitor is fabricated by depositing alternating layers of dielectric materials having either substantially different etch rates or wet etch selectivity one toward the other. The layers are isotropically etched and a cavity having corrugated sidewalls is provided. A doped poly layer is deposited to function as the storage-node capacitor plate. The deposition of a dielectric layer is followed by an insitu-doped poly layer deposited to form the upper capacitor plate. The capacitor thus formed is typified as having the storage-node capacitor plate self-aligned to the contact area of the substrate.

11 Claims, 18 Drawing Sheets

CORRUGATED STORAGE CONTACT CAPACITOR AND METHOD FOR FORMING A CORRUGATED STORAGE CONTACT CAPACITOR

FIELD OF THE INVENTION

This invention relates to semiconductor technology and, more particularly, to cell capacitors for use in dynamic random access memories (DRAMs).

BACKGROUND OF THE INVENTION

The memory cells of DRAMs are comprised of two main components: a field-effect transistor (FET) and a capacitor. In DRAM cells utilizing a conventional planar capacitor, far more chip surface area is dedicated to the planar capacitor than to the FET. In constructing such a DRAM cell, wordlines are generally etched from a polysilicon-1 layer. A doped region of silicon substrate functions as the lower (storage-node) capacitor plate, while a polysilicon-2 generally functions as the upper capacitor plate (cell plate).

Although planar capacitors have generally proven adequate for use in DRAM chips up to the 1-megabit level, they are considered to be unusable for more advanced DRAM generations. As component density in memory chips has increased, the shrinkage of cell capacitor size has resulted in a number of problems. Firstly, the alpha-particle component of normal background radiation can generate hole-electron pairs in the silicon substrate, which functions as the lower capacitor plate. This phenomena will cause a charge stored within the affected cell capacitor to rapidly dissipate, resulting in a "soft" error. Secondly, the sense amplifier differential signal is reduced. This aggravates noise sensitivity and makes it more difficult to design a sense amplifier having appropriate signal selectivity. Thirdly, as cell capacitor size is decreased, the cell refresh time must generally be shortened, thus requiring more frequent interruptions for refresh overhead The difficult goal of a DRAM designer is therefor to increase or, at least, maintain cell capacitance as cell size shrinks, without resorting to processes that reduce product yield or that markedly increase the number of masking and deposition steps in the production process.

Many manufacturers of 4-megabit DRAMs are utilizing cell designs based on nonplanar capacitors. Two basic capacitor designs are currently in use: the trench capacitor and the stacked capacitor. Both types of non-planar capacitors typically require a considerable greater number of masking, deposition and etching steps for their manufacture than does a planar capacitor.

In a trench capacitor, charge is stored primarily vertically, as opposed to horizontally in a planar capacitor. Since trench capacitors are fabricated in trenches which are etched in the substrate, the typical trench capacitor, like the planar capacitor, is subject to soft errors. In addition, there are several other problems inherent in the trench design. One problem is that of trench-to-trench charge leakage, caused by the parasitic transistor effect between adjacent trenches. Another problem is the difficulty of completely cleaning the trenches during the fabrication process; failure to completely clean a trench will generally result in a defective cell.

The stacked capacitor design, on the other hand, has proven somewhat more reliable and easier to fabricate than the trench design. Since both the lower and the upper plates of a typical stacked capacitor are formed from individual polysilicon layers, the stacked capacitor is generally much less susceptible to soft errors than either the planar or trench capacitors. By placing both the wordline and the digit line beneath the capacitive layers, and having the lower layer make contact with the substrate by means of a buried contact, some manufacturers have created stacked capacitor designs in which vertical portions of the capacitor contribute significantly to the total charge storing capacity. Since a stacked capacitor generally covers not only the entire area of a cell (including the cell's access FET), but adjacent field oxide regions as well, capacitance is considerably enhanced over that available from a planar type cell. On the negative side, processing steps are complex since correct alignment of the lower capacitor plate to the substrate contact area is critical. It is also difficult to maximize the amount of contact between the lower capacitor plate and the substrate contact area.

Although the stacked cell capacitor is generally considered by many experts to be the wisest choice for the 4-megabit generation, trenches are generally considered to be the best choice for the 16-megabit generation and beyond, due to the fact that trenches can be made deeper for increased capacitance without affecting topography of the array.

SUMMARY OF THE INVENTION

The invention is directed to maximizing storage cell surface area in a high density/high volume DRAM fabrication process using minimal processing steps. The invention is adaptable to the 4-megabit generation and larger. The surface area is increased by fabricating a storage contact capacitor having a noncritical alignment to the substrate contact area and having corrugated sidewalls. The processing steps are simplified and the error factor is reduced increasing yield.

The invention is implemented by depositing and planarizing an initial layer of dielectric overlying FETs and wordlines which have previously been protected with a blanket deposition of an etch stop layer. By utilizing the etch stop layer the patterning of future capacitor regions is not critical. In fact, the mask can define areas larger than the substrate to capacitor contact area without degrading any other layers already fabricated. This advantage allows maximum capacitor to substrate contact thus increasing capacitance without increasing the size of the DRAM device.

Alternating layers of dielectric material having either substantially different etch rates or wet etch selectivity one toward the other are then deposited, masked and etched to form the noncritical opening for the formation of the storage contact capacitor.

A wet etch is then implemented. Since more of one type of the deposited layers will be consumed by the wet etch, the opening defining the future capacitor has corrugated sidewalls. The corrugated sidewalls enhance capacitance while minimizing DRAM area affected by the capacitor formation.

After the removal of the etch stop in the opening defining the cell, the capacitor layers, comprising the storage-node capacitor plate, the dielectric and the upper capacitor plate are blanket deposited. The resultant capacitor is a plug having a core with sidewalls self-aligned to the contact area. The core and sidewalls are substantially normal to a top surface of the substrate. Fingers extend normally to the core where the dielectric was consumed by the wet etch. The fingers effect the corrugation.

The process is completed by forming a contact plug and interconnect lines.

The invention results in a storage cell having a cell size of 1.6 um² and a capacitor of 8.6 um².

DETAILED DESCRIPTION OF THE PREFERRED EMBODIMENT

The invention is directed to maximizing storage cell surface area in a high density/high volume DRAM fabrication process by effecting storage capacitors having noncritical alignment to the substrate contact area and having corrugated sidewalls. The process sequence is shown in FIGS. 1 through 17.

The capacitor of each cell makes contact with a buried contact within the cell, while the capacitor extends to the active area of an adjacent cell. Each active area within the array is isolated one from another by a thick oxide. The active areas can be arranged in interdigitated columns and noninterdigitated rows or simply parallel and in line to one another in both the vertical and horizontal directions. The active areas are used to form active metal-oxide semiconductor (MOS) transistors that can be doped as NMOS or PMOS type field-effect transistors (FETs) depending on the desired use.

Figure 1:
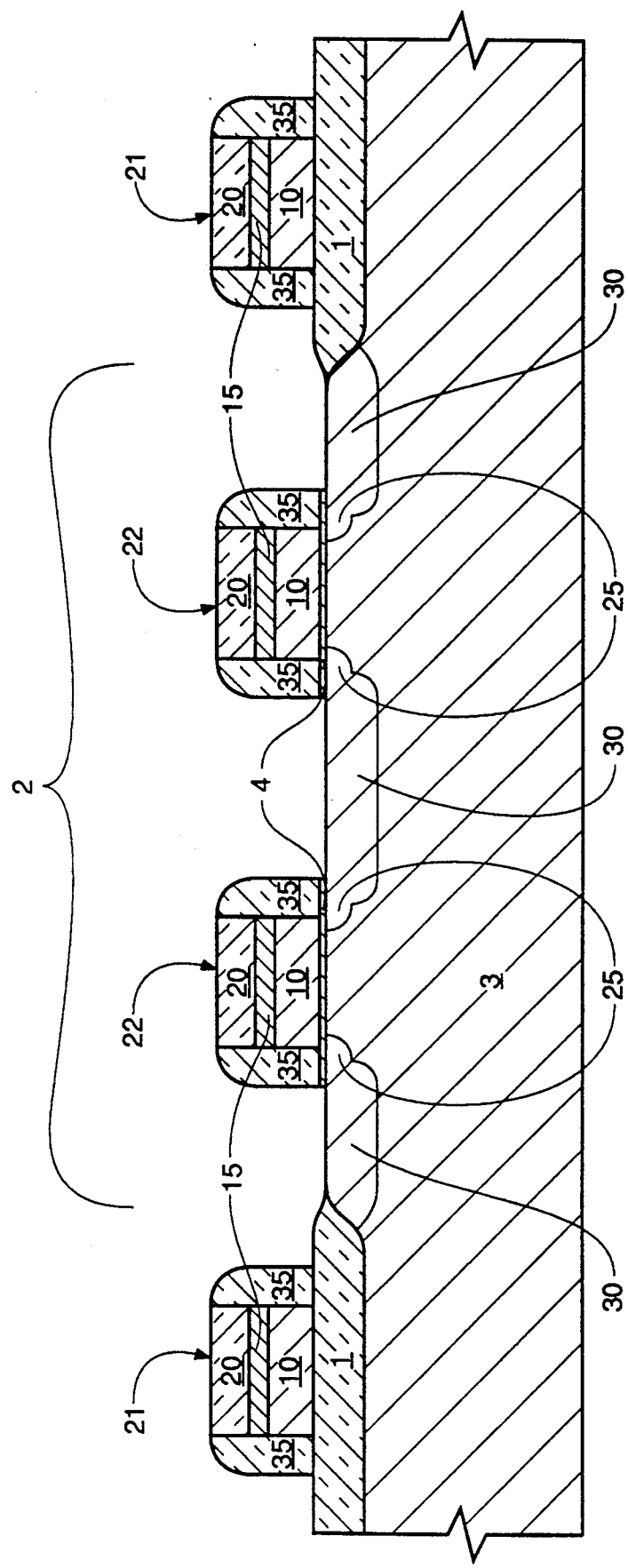
FIG. 1 is a cross-sectional view of a portion of a partially-processed semiconductor wafer which depicts a field-effect transistor (FET) and wordline overlying a silicon substrate.

Referring now to FIG. 1, a cross-sectional view of an in-process DRAM cell is shown following conventional local oxidation of silicon (LOCOS) or special LOCOS processing which creates substantially planar field oxide regions 1 and future active areas 2 (those regions of the substrate not covered by field oxide) on a silicon substrate 3. The creation of the field oxide is preceded by a thermally grown dielectric layer 4 of silicon oxide. The depicted cell is one of many cells that are fabricated simultaneously and comprise a memory array. Following the creation of the field oxide region 1 and dielectric layer 4 a first conductively doped polysilicon layer 10, a metal silicide layer 15 and a thick nitride layer 20 are deposited. The layers are patterned and etched to form wordlines 21 and field-effect transistors (FETs) 22. The conductively doped polysilicon layer forms the gate regions of the FETs and is insulated from lightly-doped source/drain regions 25 and heavily-doped source/drain regions 30 by the dielectric layer 4. The lightly-doped source/drain regions 25 are created utilizing a phosphorus implant. Deposition, densification and a reactive ion etch (RIE) of a SiO₂ spacer layer has created principal spacers 35 which offset an arsenic implant used to create the heavily-doped source/drain regions 30.

Although the formation of the FETs 22 and wordlines 21, as described, are preferred, other methods of fabrication are also feasible and perhaps equally viable. The following steps represent the method of the preferred embodiment for creating the storage capacitor of the invention.

Figure 2:
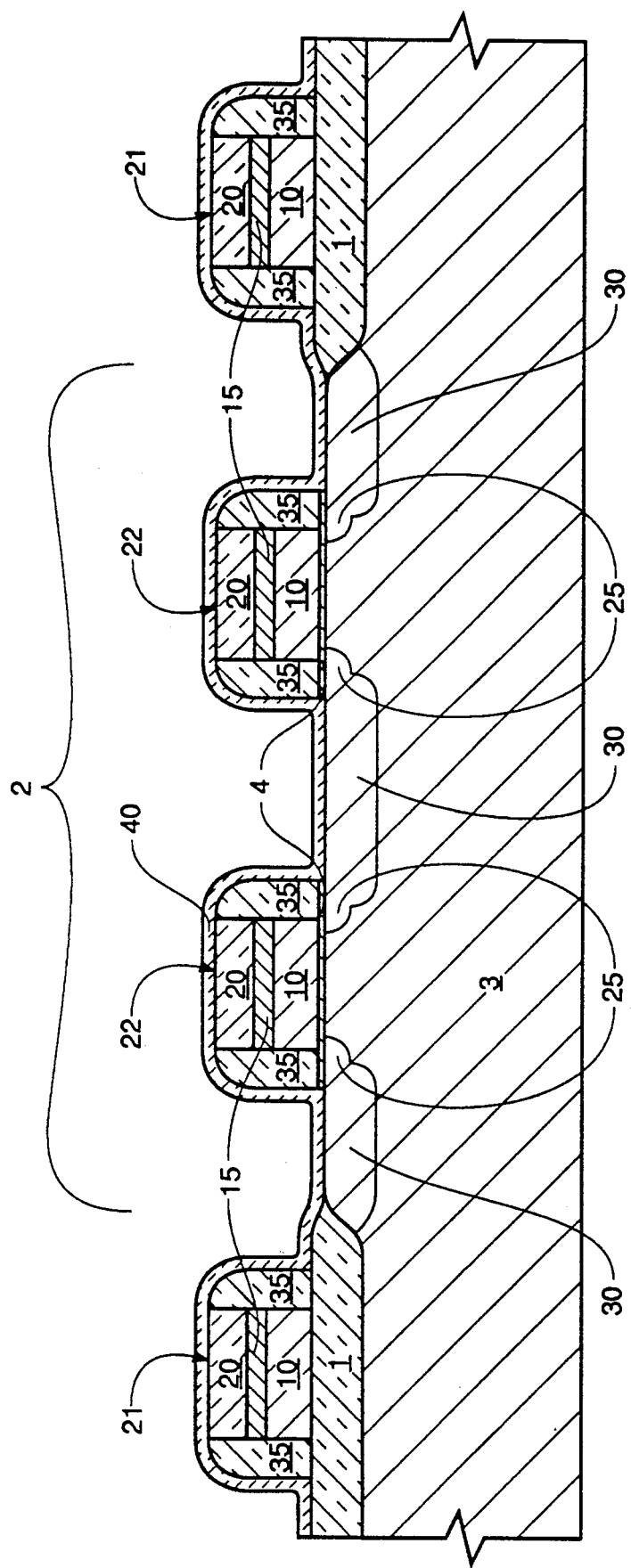
FIG. 2 is a cross-sectional view of the wafer portion of FIG. 1 following a blanket deposition of an etch stop layer.

In FIG. 2 a conformal etch stop layer 40 is blanket deposited. This etch stop layer 40 performs etch stop functions during subsequent etching steps. Materials suitable to perform the etch stop functions comprise aluminum oxide, aluminum nitride, silicon carbide, barium oxide, and any etch stop ceramic.

Figure 3:
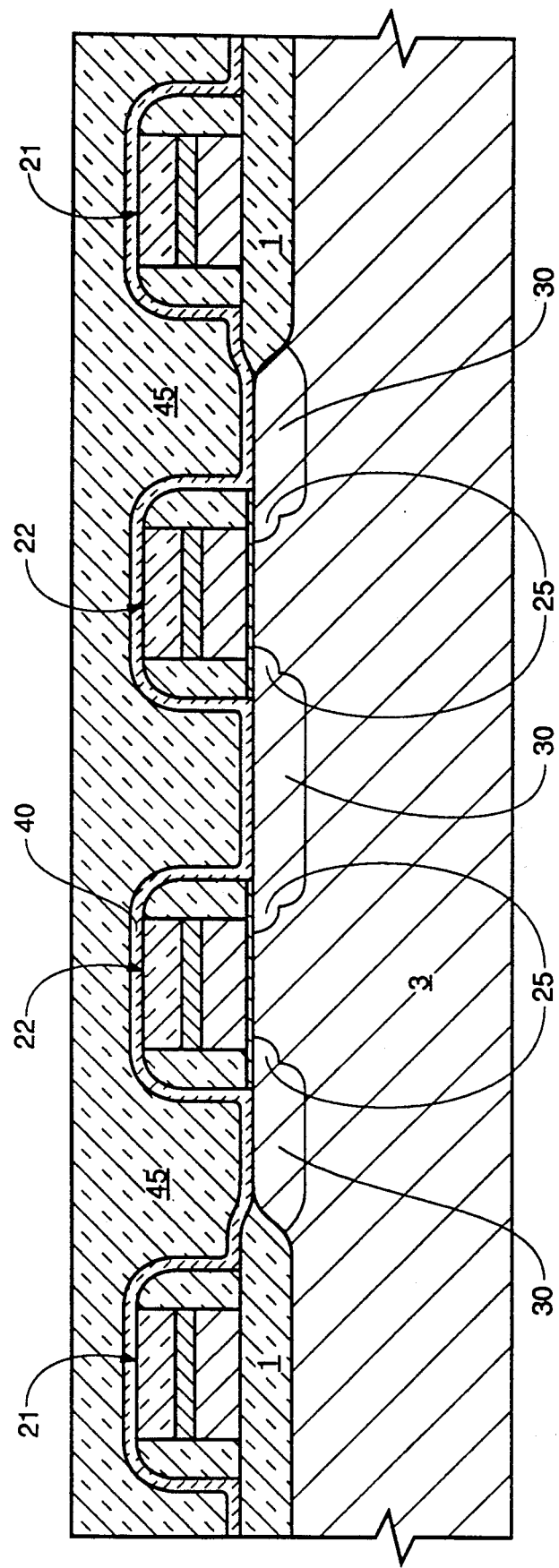
FIG. 3 is a cross-sectional view of the wafer portion of FIG. 2 following a planarization of a blanket deposition of a dielectric layer.

In FIG. 3 a dielectric layer 45 preferably comprising silicon oxide is deposited to cover all structures previously formed. The dielectric layer 45 is planarized. A chemical mechanical polish (CMP) is the preferred method of planarization.

Figure 4:
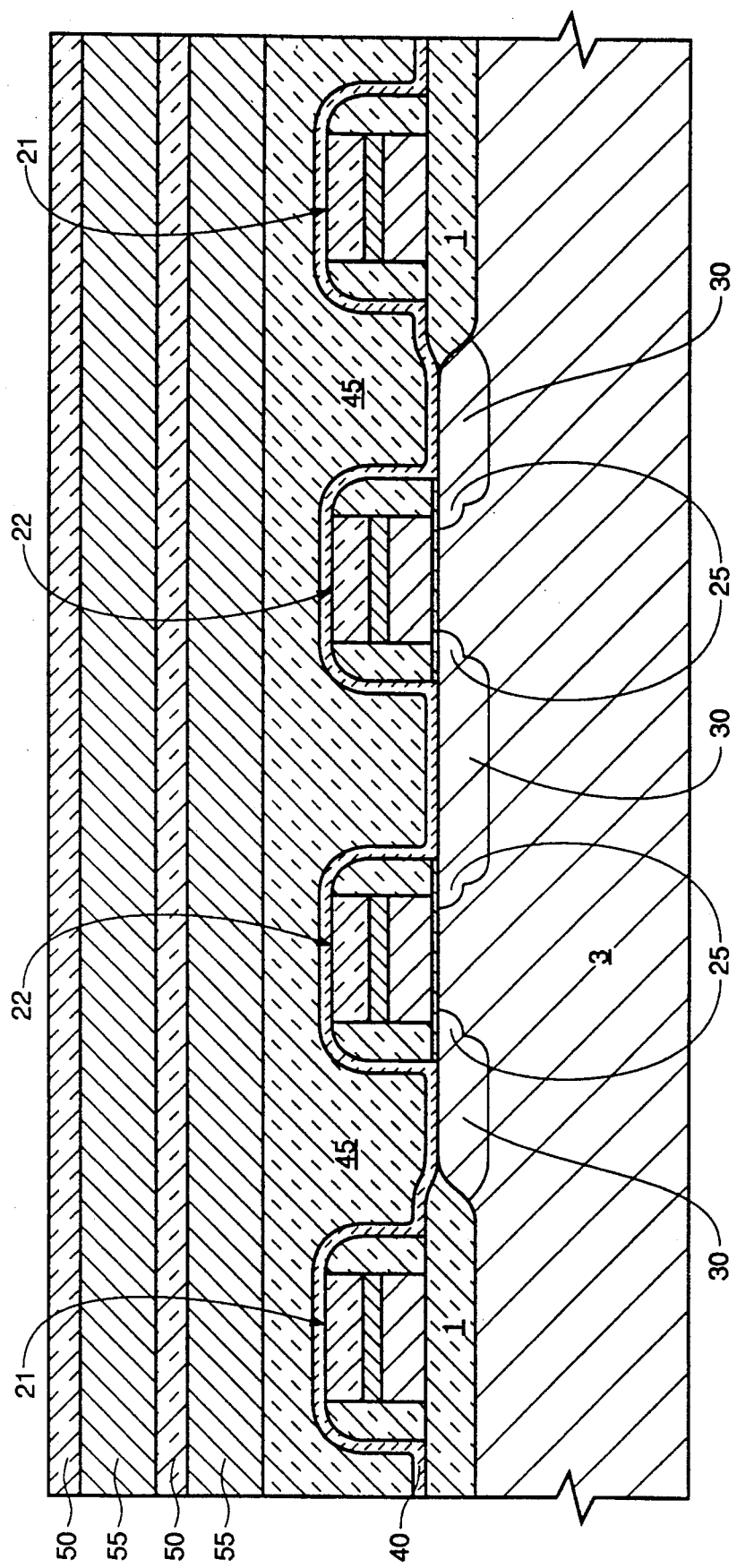
FIG. 4 is a cross-sectional view of the wafer portion of FIG. 3 following the deposit of alternating layers of dielectric materials having wet etch selectivity one toward the other.

In FIG. 4 the planarized dielectric is overlaid with alternating layers of dielectric materials having a wet etch selectivity one toward the other. SiO₂, the slower etch layer 50, and Si₃N₄, the faster etch layer 55, are the preferred dielectrics, however, ozone tetraethyl orthosilicate (TEOS) and PTEOS or other combinations may be used. A polysilicon film may be used as one of the alternating layers. In this case oxidation steps are required after exposing the layers during subsequent etching.

Figure 5:
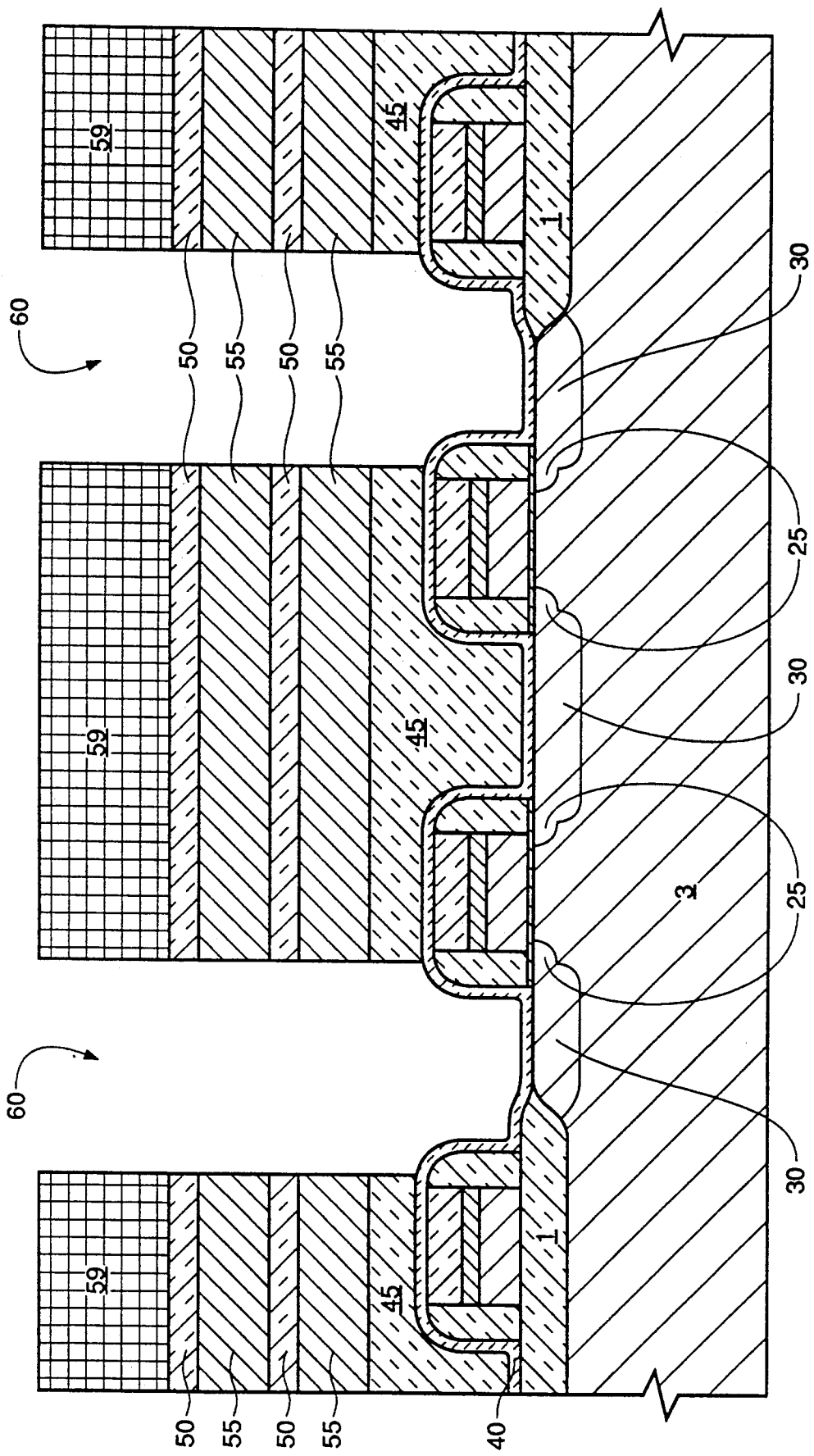
FIG. 5 is a cross-sectional view of the wafer portion of FIG. 4 following a mask and etch of memory cell locations.

In FIG. 5 a photoresist mask 59 defines noncritical memory cell locations for future contact of the fabricated capacitor with buried contact regions of the heavily doped region 30. In FIG. 5 the dielectric layers 50, 55, and 45 are RIE etched and form openings 60. The mask alignment is noncritical due to the previous deposition of the etch stop layer 40. The mask 59 defines wide openings 60 without compromising the integrity of previously formed structures. Since the openings 60 can be wide the substrate contact area and vertical area available for capacitor fabrication is maximized thereby increasing capacitance. In addition to increased capacitance, the error factor is reduced and yield is increased. Optimally polymer spacer technology is utilized for minimizing critical dimension (C.D.) of the pattern.

Figure 6:
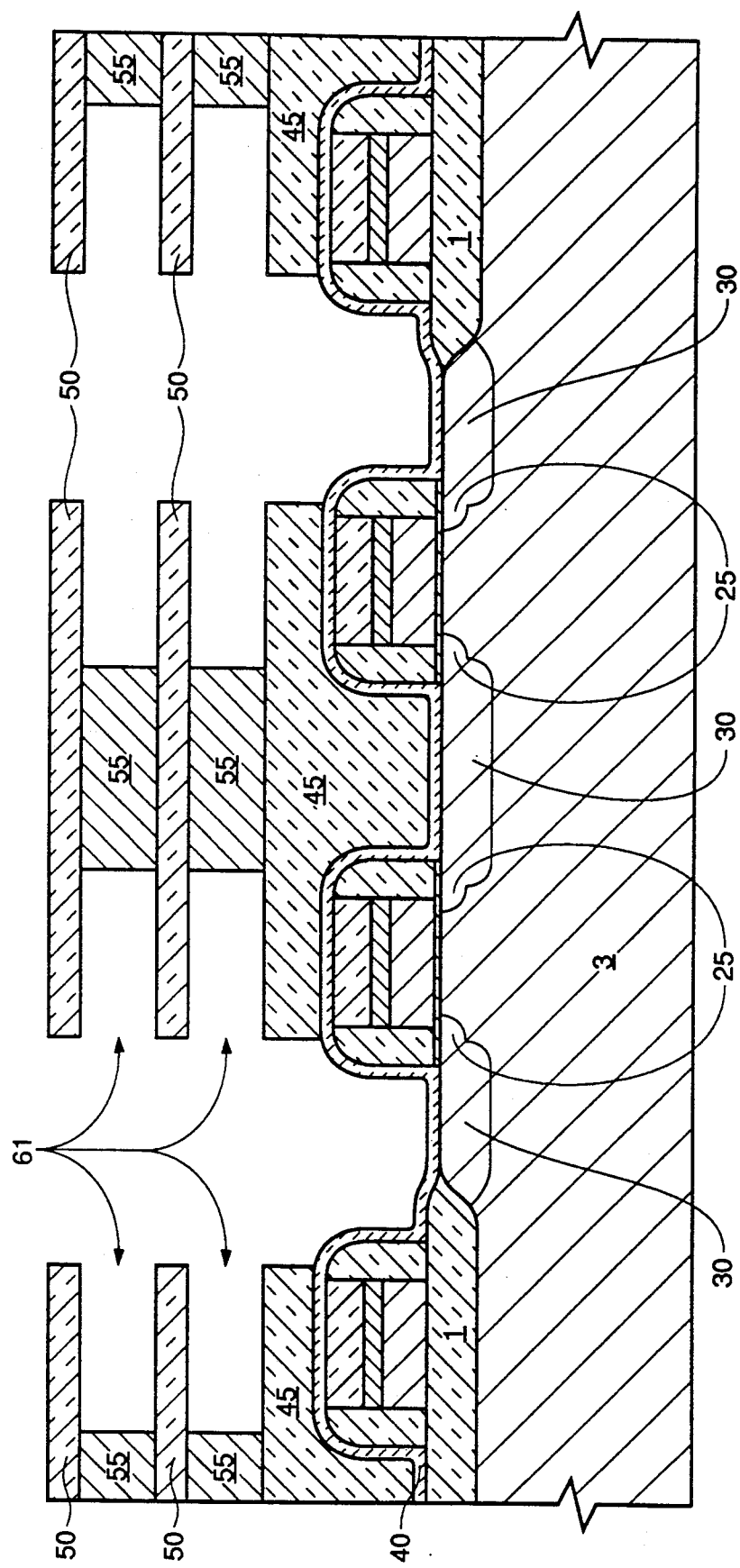
FIG. 6 is a cross-sectional view of the wafer portion of FIG. 5 following an isotropic etch of the dielectric layers.

In FIG. 6 the dielectric layers 50 and 55 are selectively and isotropically etched. The etch consumes the faster etch layer comprising $Si_3N_4$ 55 effecting corrugated sidewalls 61. The corrugations resemble fingers 62 extending normally from the openings 60, each finger having a horizontal complementary finger extending in the opposite direction. For example, fingers 62a and 62b are complementary. During this isotropic etch and the RIE etch, the etch stop layer 40 effects self-alignment of contacts to the polysilicon and acts as an etch stop. If polysilicon is selected for one of the alternating layers, an oxidation process needs to be performed after the isotropic etch and prior to the etch of the etch stop layer.

Figure 7:
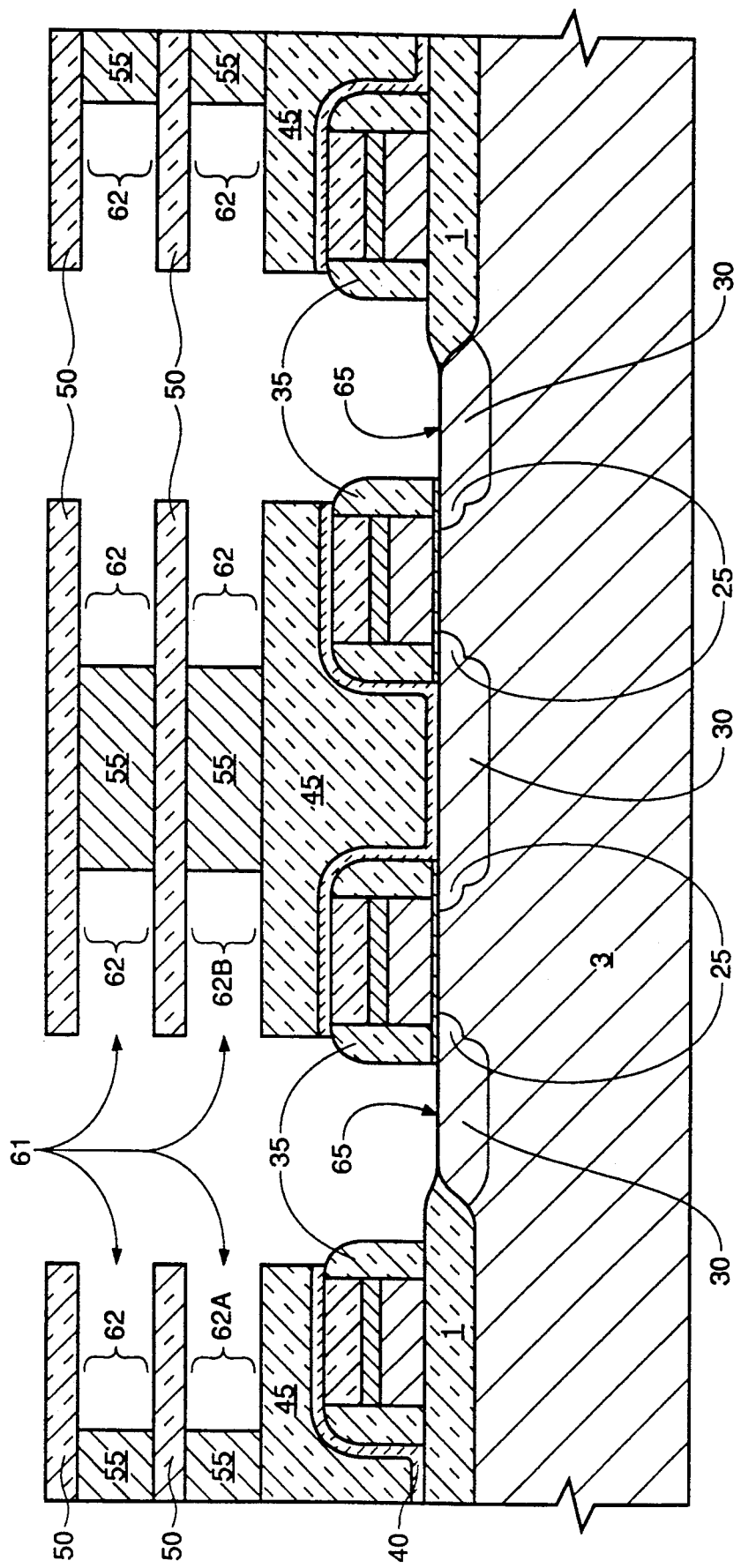
FIG. 7 is a cross-sectional view of the wafer portion of FIG. 6 following the removal of the etch stop layer.

In FIG. 7 the etch stop layer 40 exposed during the preceding isotropic etch is removed with a dry etch using $BCl_3$ plus $Cl_2$ or a wet etch using hot $H_3PO_4$ when the etch stop layer 40 is $Al_2O_3$. The etch of the etch stop is implemented without affecting the integrity of any of the dielectric layers 45, 50, and 55 or principal spacers 35. Etching the etch stop layer 40 exposes the substrate thereby providing a buried contact region 65 in which the capacitor can be formed.

Figure 8:
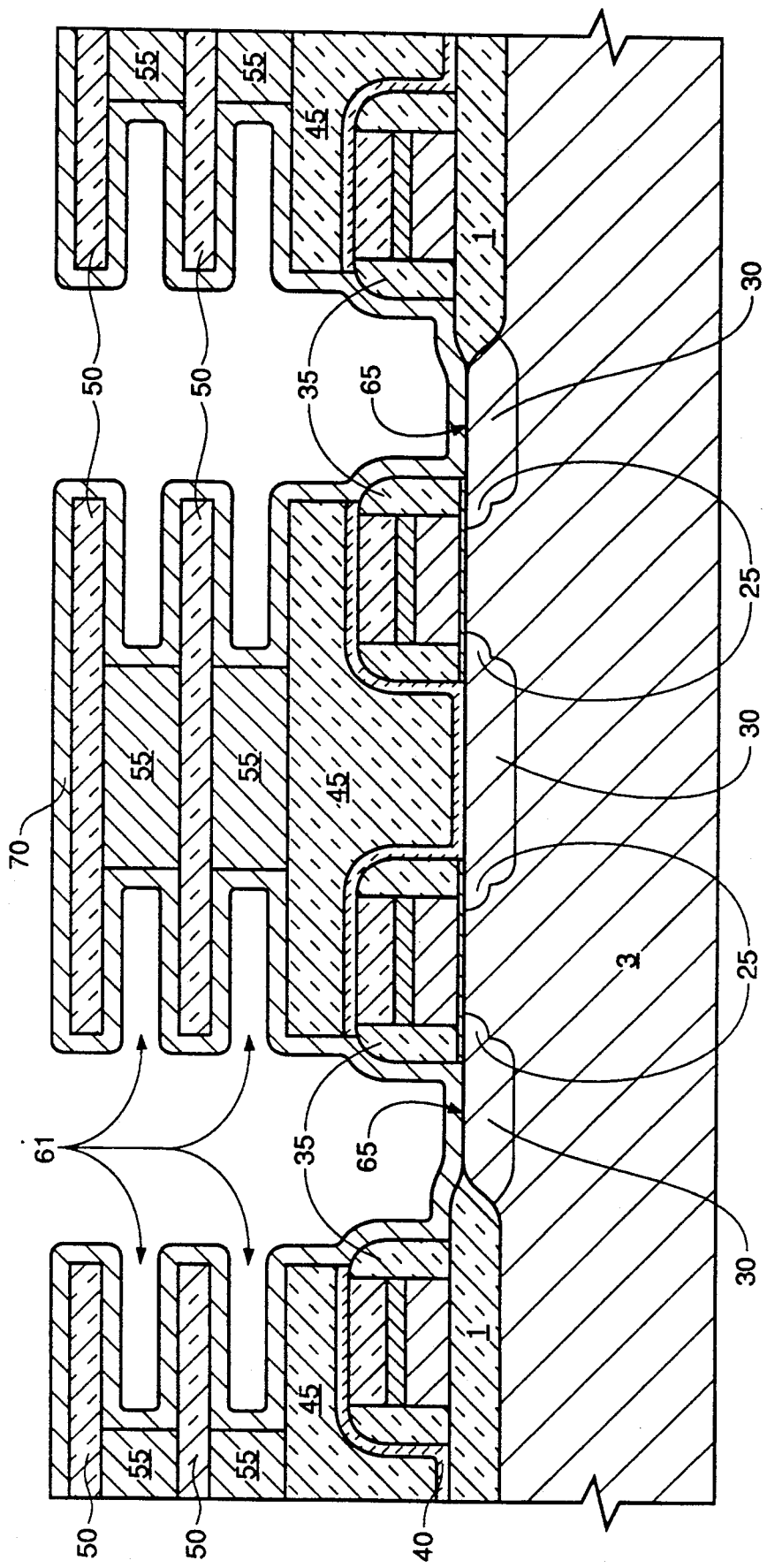
FIG. 8 is a cross-sectional view of the wafer portion of FIG. 7 following the deposit of a doped poly layer.

In FIG. 8 a doped poly layer 70 is deposited. The doped poly layer functions as the storage-node capacitor plate 70, the doping increasing the dielectric constant of the storage-node capacitor plate. The area of the storage-node capacitor plate is significantly increased over the area of a storage-node capacitor plate fabricated in a vertical trench. This increased area is effected without increasing the die size of the DRAM device. This increase in area effects a directly proportional increase in capacitance.

Figure 9:
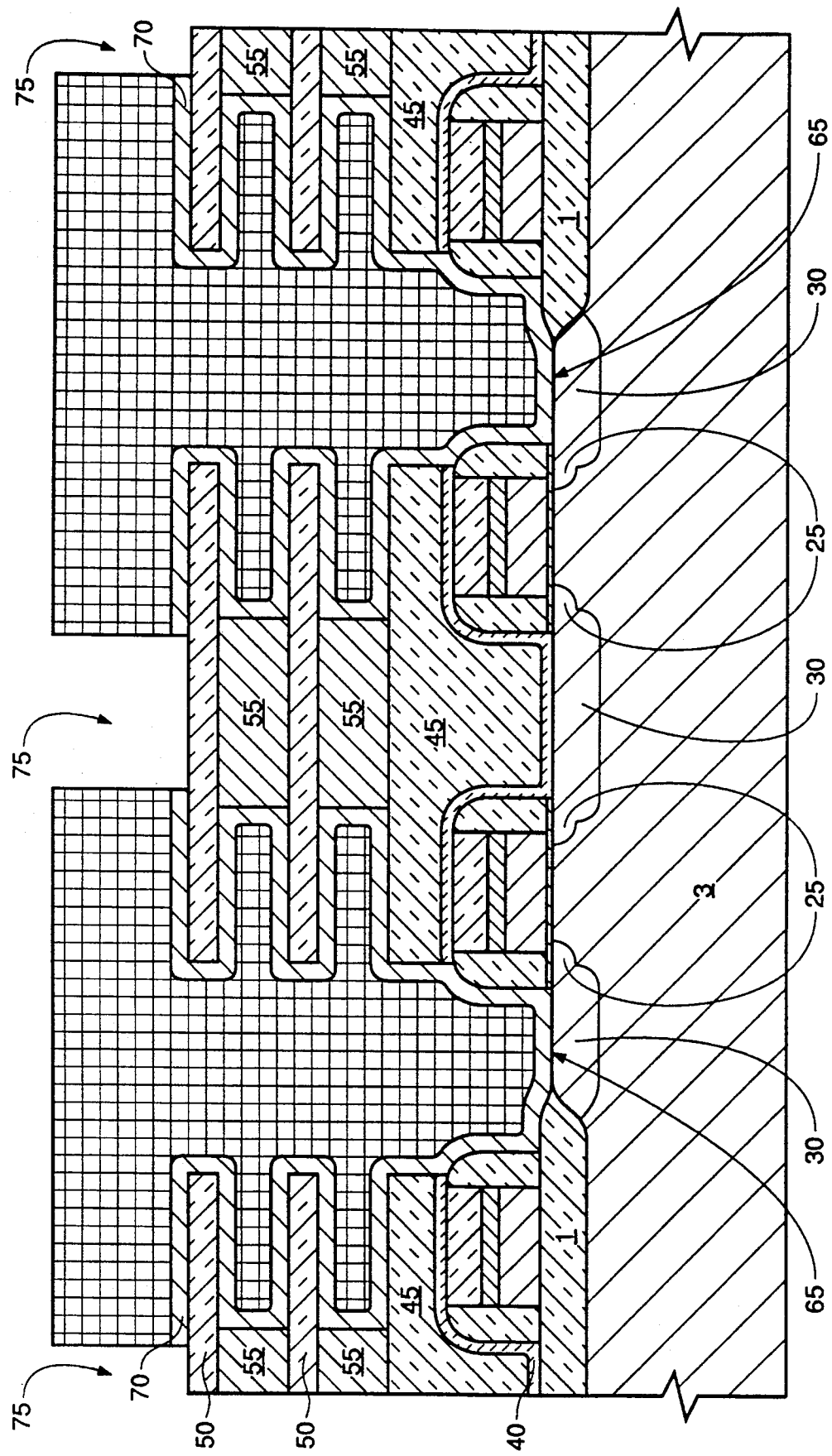
FIG. 9 is a cross-sectional view of the wafer portion of FIG. 8 following the mask and etch of the doped poly layer.

In FIG. 9 the doped poly layer 70 is patterned and etched to form opening 75 in order to isolate simultaneously fabricated lower capacitor plates of a plurality of storage capacitors one from another.

Figure 10:
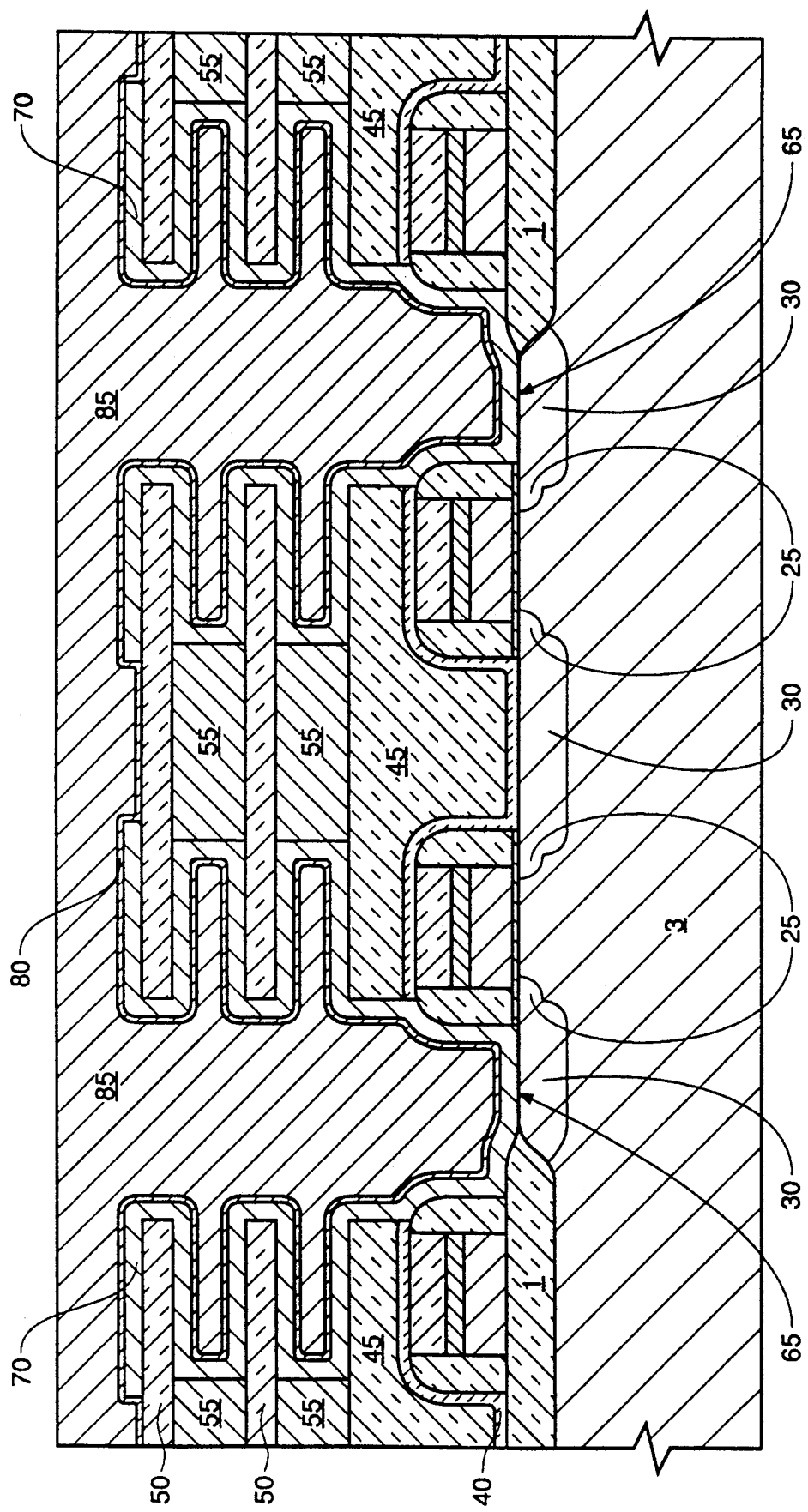
FIG. 10 is a cross-sectional view of the wafer portion of FIG. 9 following the deposit of the cell dielectric and the upper capacitor plate.

In FIG. 10 the capacitor cell dielectric 80 (ceramic) is deposited and an insitu-doped poly is deposited to form the upper capacitor plate 85. The cell dielectric 80 is preferably $Si_3N_4$. The insitu-doped poly also fills capacitor holes. Thin noninsitu-doped poly may be used if it is followed with a thicker deposition and then doped with phosphorous. The upper capacitor plate may also be etched back if desired. In either case, doping increases the dielectric constant of the capacitor plate thus formed.

Figure 11:
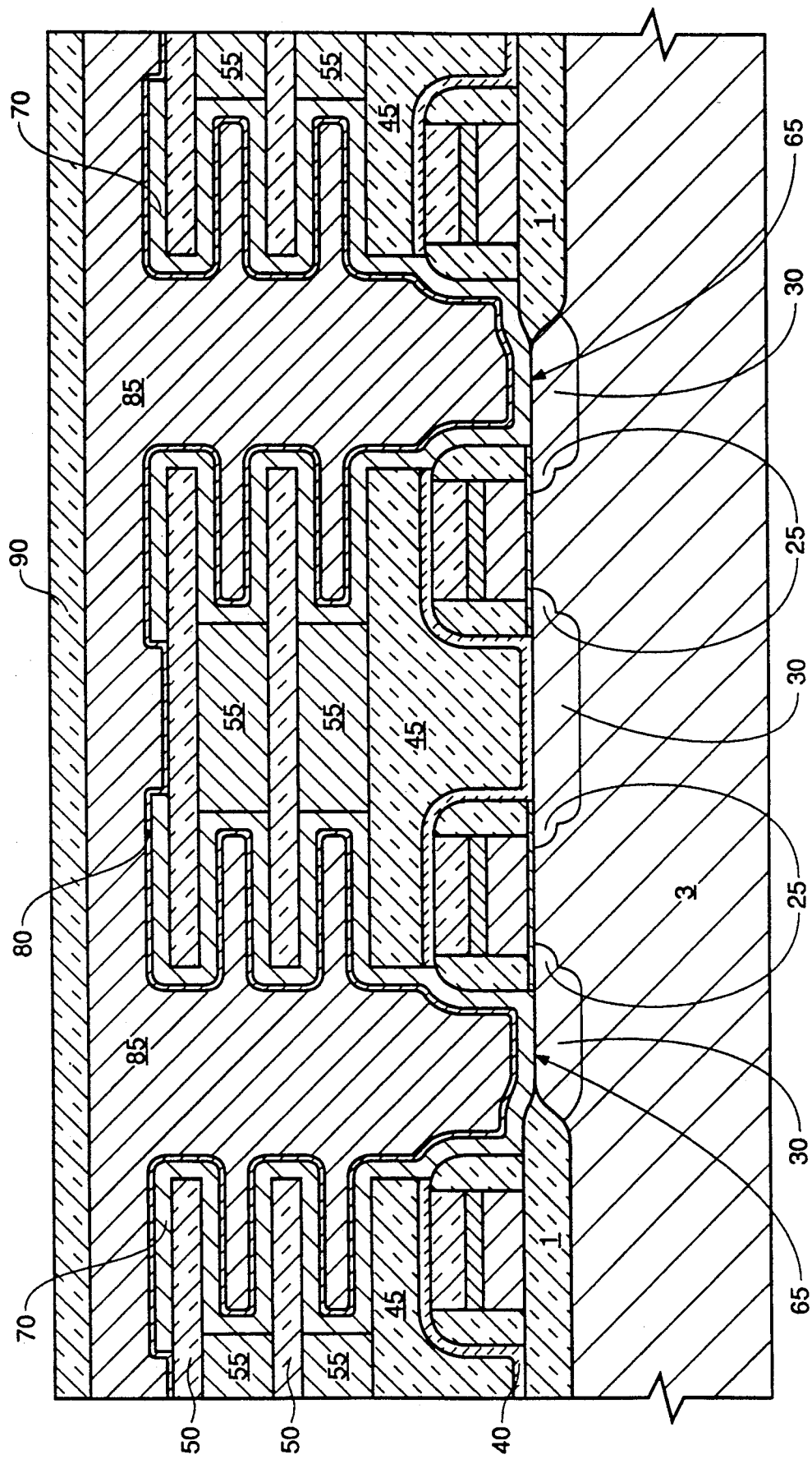
FIG. 11 is a cross-sectional view of the wafer portion of FIG. 10 following the deposit of an insulating material.

In FIG. 11 an insulating material 90 is blanket deposited overlying the upper capacitor plate in order to isolate the upper capacitor plate 85 from ensuingly formed interconnect lines. The preferred insulating material is $SiO_2$.

Figure 12:
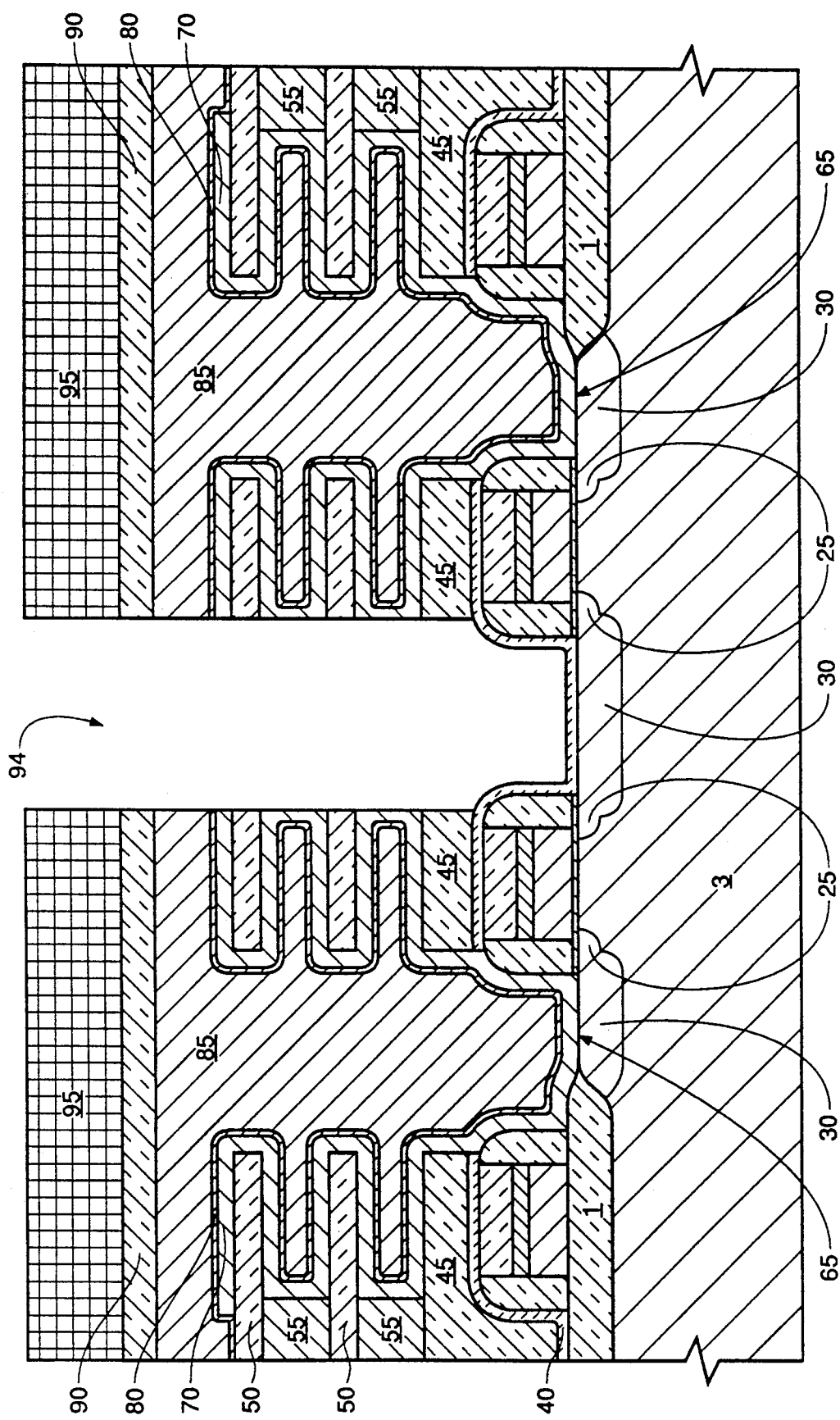
FIG. 12 is a cross-sectional view of the wafer portion of FIG. 11 following a mask and etch of the process layers up to and excluding the etch stop material.
Figure 13:
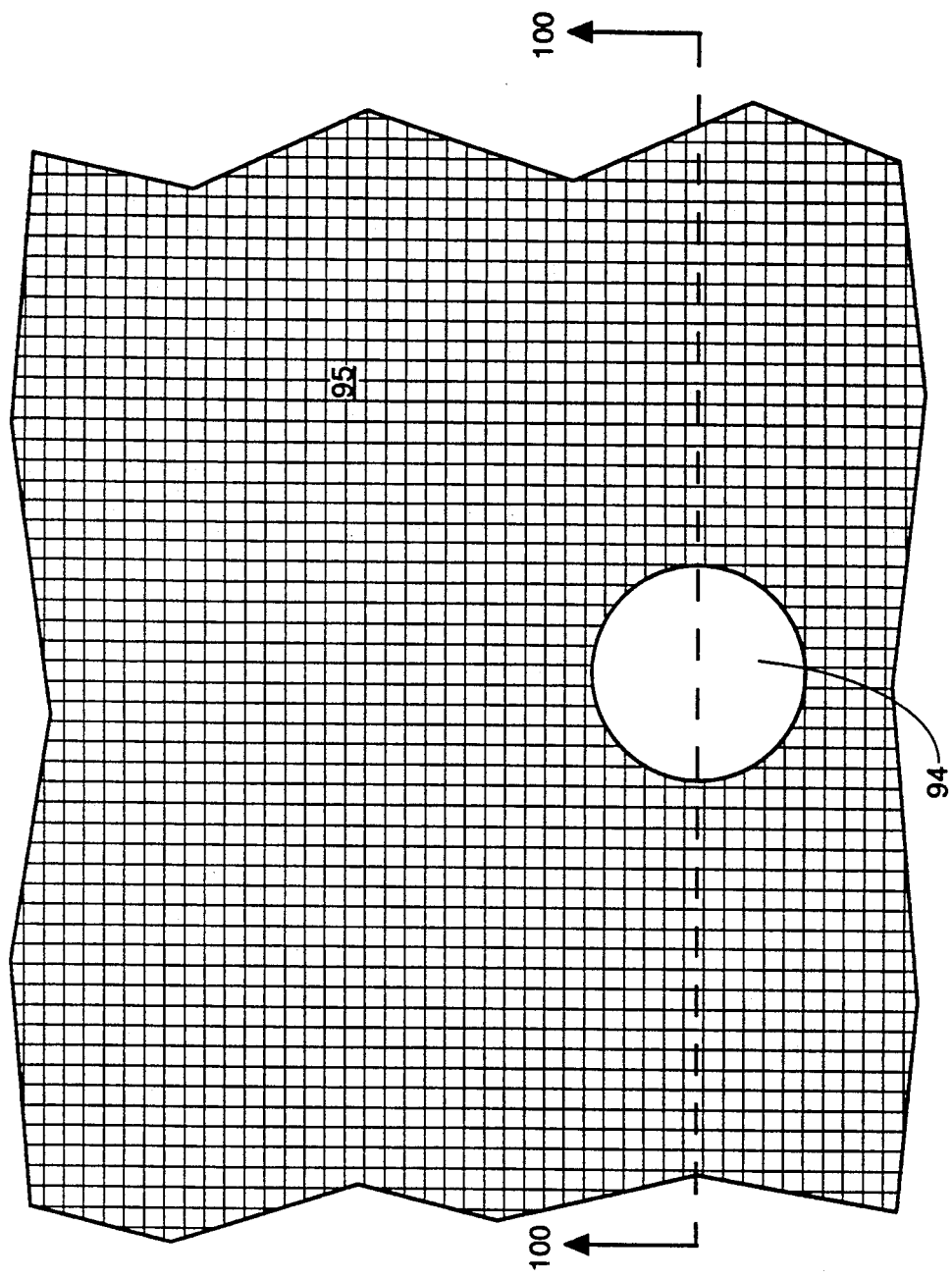
FIG. 13 is a planar view of the wafer portion of FIG. 12 depicting the opening provided by the mask and etch shown in FIG. 12.

In FIG. 12 the process layers are etched using RIE with selectivity to the dielectric layer 80 of $Si_3N_4$ over the etch stop layer 40 to form an opening 94 substantially defined by mask 95. The top planar view shown in FIG. 13 illustrates the fact that the mask 95 defines a specific region for opening 94 in which a contact plug may be formed. Dashed line 10 defines the cross section shown in FIG. 12.

Figure 14:
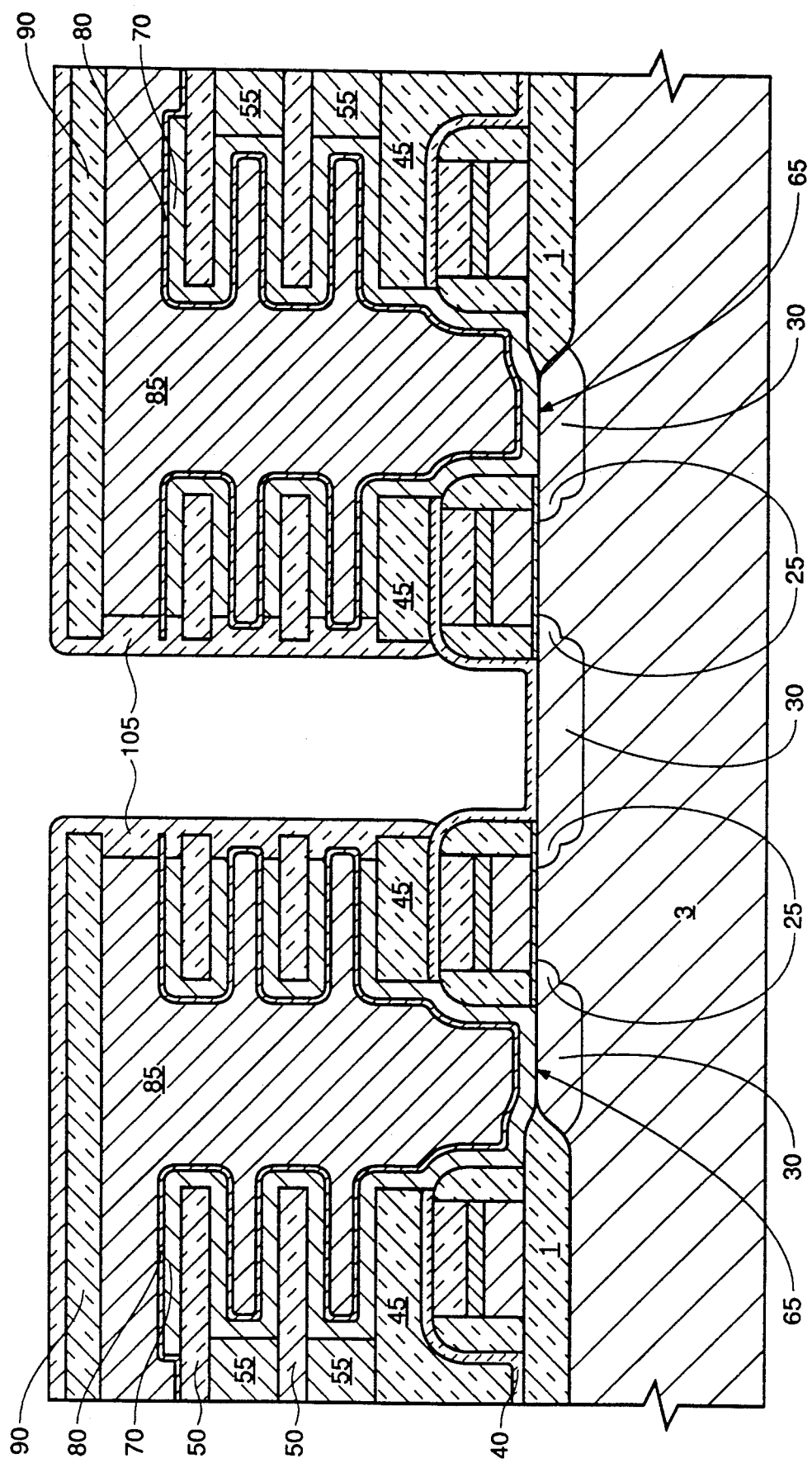
FIG. 14 is a cross-sectional view of the wafer portion of FIG. 12 following an oxidization of the sides of the opening shown in FIG. 12.

In FIG. 14 the sides of the opening 94 are oxidized to insulate the exposed poly with an insulative layer 105. The etch stop layer 40 prevents oxidation of the substrate 3. Any oxidation of the insulative material 90 is not critical. It is possible to skip a photo/etch step of the upper plate if second level metal is used for the grounding connection.

Figure 15:
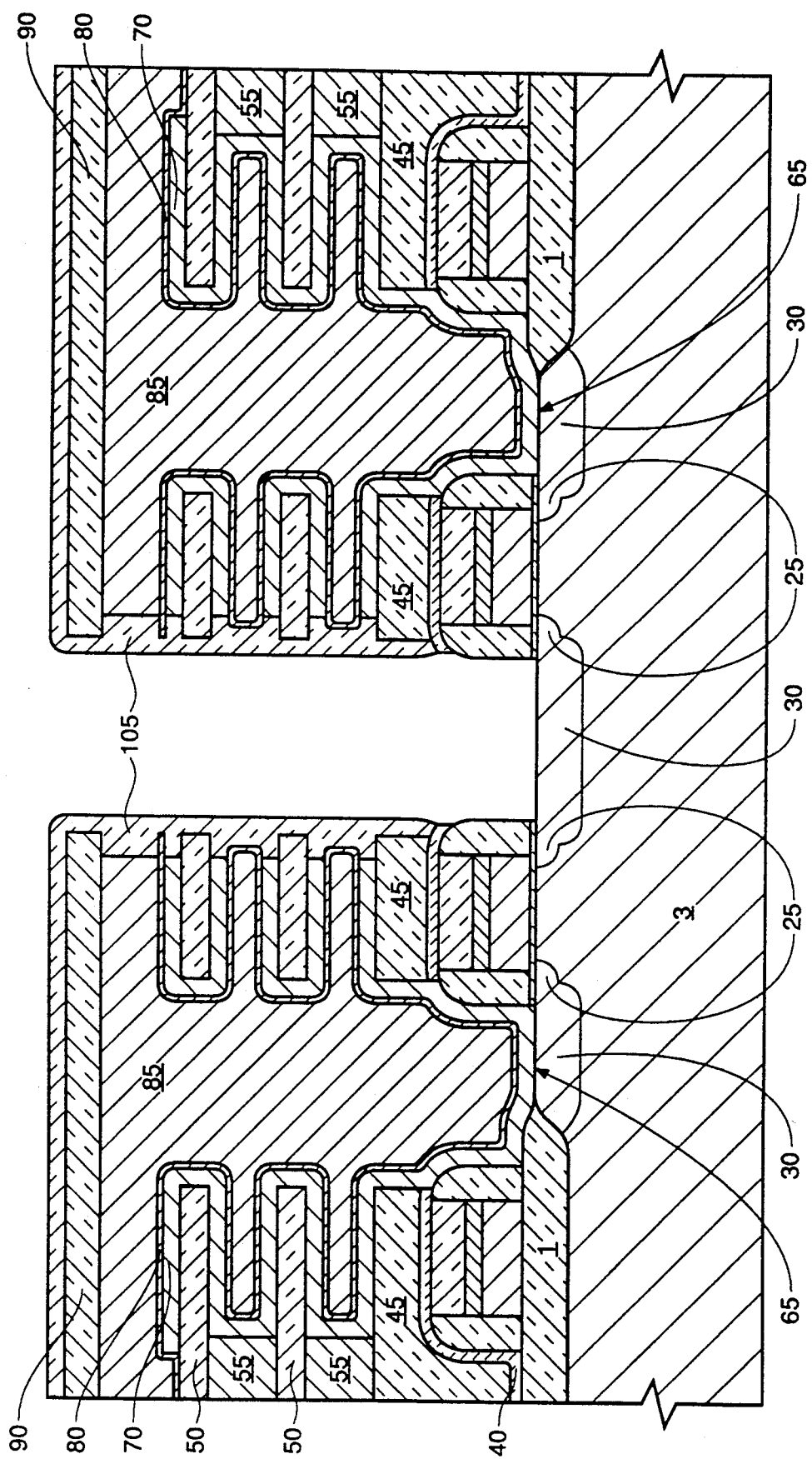
FIG. 15 is a cross-sectional view of the wafer portion of FIG. 14 following the removal of the etch stop layer in the bottom portion of the opening shown in FIG. 12.

In FIG. 15 the etch stop layer 40 covering the source/drain region 25 in opening 94 is extracted (dipped out) exposing source/drain region 25. After the removal of the etch stop layer 40 the metalization process begins. Although one of many metalization processes may be implemented without detracting from the invention, the following process steps are preferred.

Figure 16:
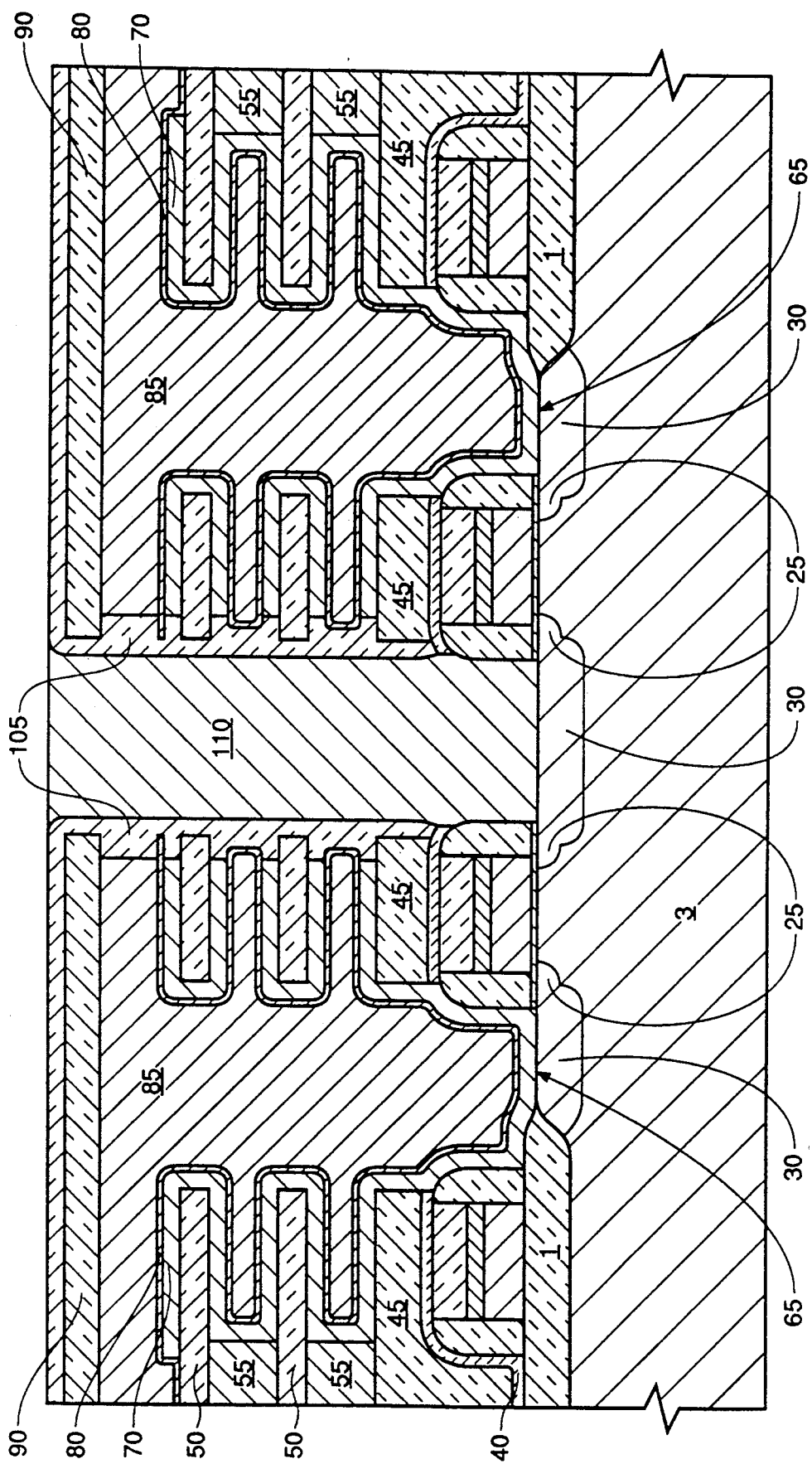
FIG. 16 is a cross-sectional view of the wafer portion of FIG. 15 following the formation of a tungsten plug.

In FIG. 16 a tungsten plug 110 is deposited in the opening and planarized.

Figure 17:
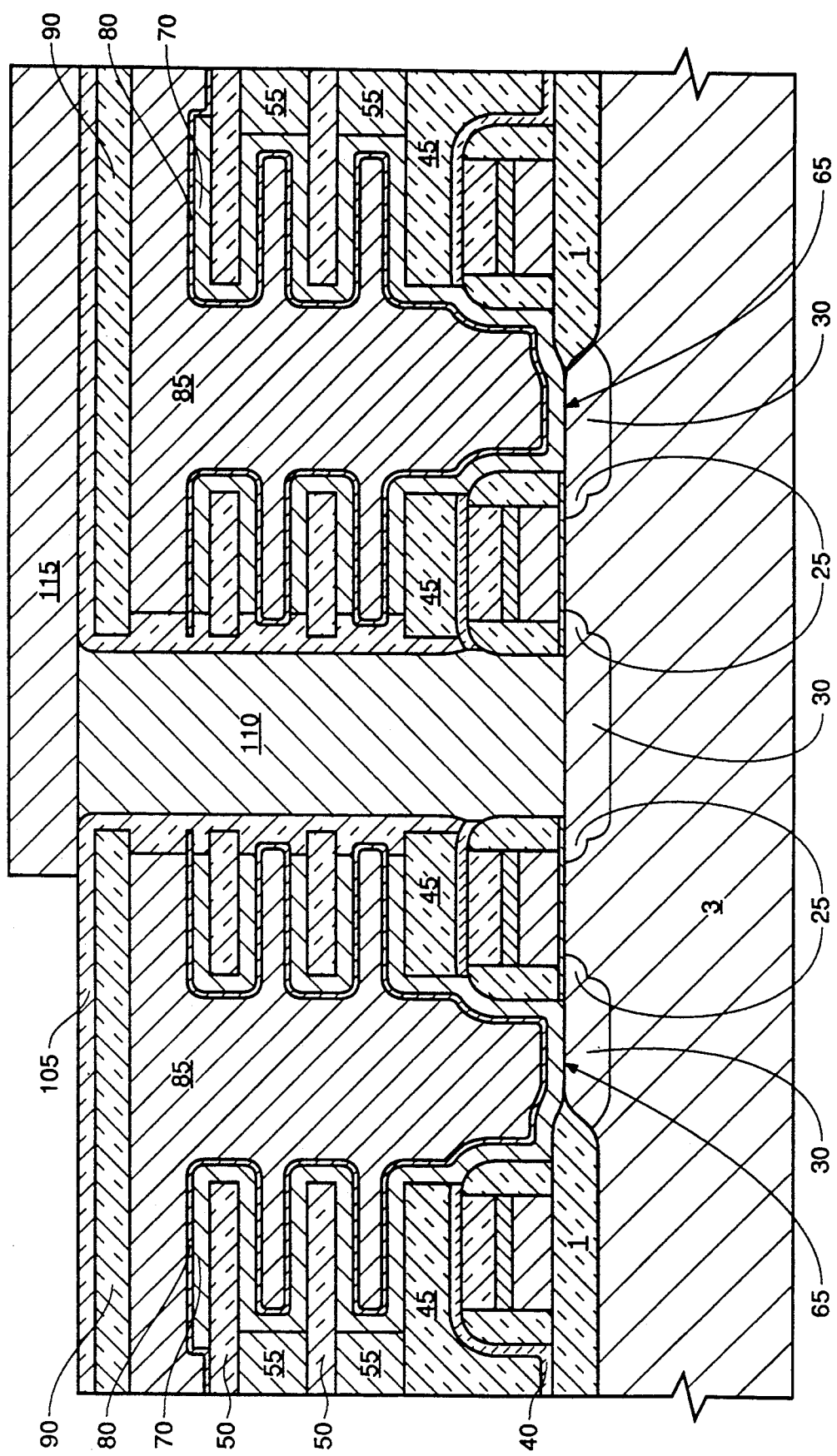
FIG. 17 is a cross-sectional view of the wafer portion of FIG. 16 following the formation of a conductive interconnect line.

In FIG. 17 a conductive interconnect line 115 is fabricated to contact the tungsten plug 110.

Figure 18:
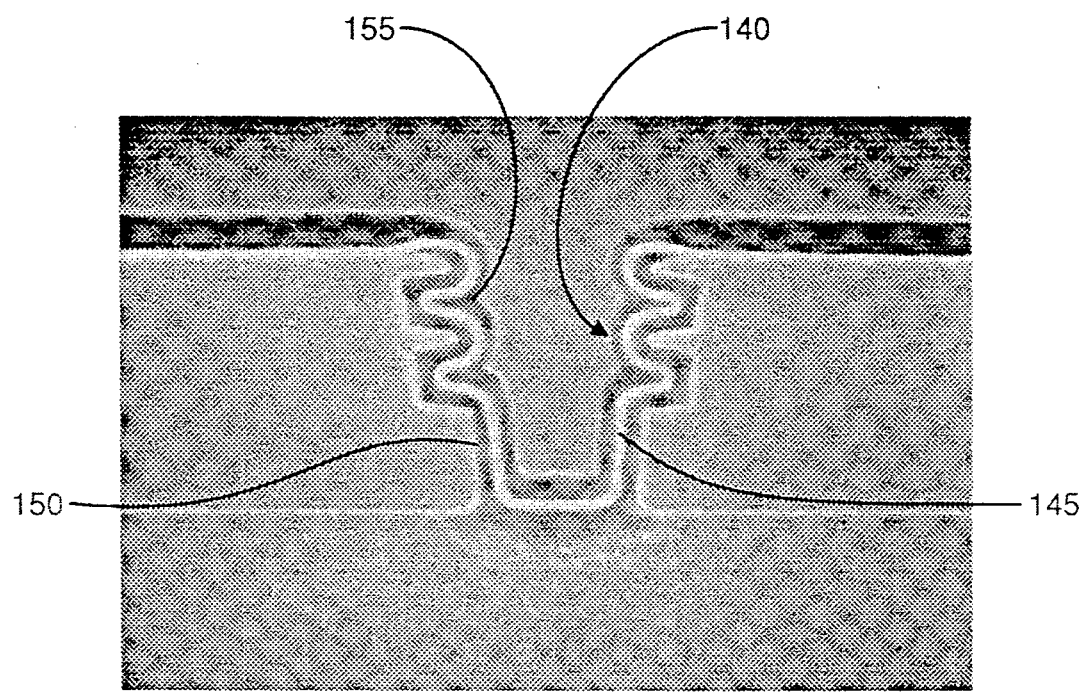
FIG. 18 is a cross-sectional view of a micrograph depicting the corrugated storage contact capacitor of the invention and fabricated by the method of the invention.

FIG. 18 is a cross-sectional view of a gray-scale reproduction of a micrograph depicting the corrugated storage contact capacitor of the invention. The etching of the alternating layers of dielectric materials defines the corrugated feature 140 of the invention. The dielectric layer 145 is sandwiched between the storage-node capacitor plate 150 and the upper capacitor plate 155.

Although a preferred embodiment of the invention has been herein described, it will be apparent to one skilled in the art that changes and modifications may be made thereto without departing from the spirit and scope of the invention as claimed.

What is claimed is:

1. A method for forming at least one capacitor in a semiconductor device having fabricated structures overlying a substrate, the method comprising the following steps:
   a) depositing an etch stop layer to overlie the fabricated structures and the substrate;
   b) depositing an insulative layer, said insulative layer overlying said etch stop layer and filling any depressions lying between the fabricated structures;
   c) planarizing said insulative layer to provide a planar surface overlying the fabricated structures and said etch stop layer;
   d) alternately depositing of at least a conformal first etch type layer and a conformal second etch type layer, said first etch type layer capable of being substantially more consumed during an etch than said second etch type layer and said insulative layer;
   e) etching an opening in said first and second etch type layers and said insulative layer in order to expose said etch stop overlying a contact area of said substrate;
   f) etching a portion of said first etch type layer while substantially retaining said second etch type layer and said insulative layer, and prohibiting etching of the substrate with said etch type layer;
   g) etching said etch stop in order to expose said contact area;
   h) depositing a first conductive layer to contact said first and second etch type layers, said insulative layer, and said contact area, said first conductive layer forming a first capacitor plate;

i) depositing a dielectric layer to contact said first layer; and j) depositing a second conductive layer to contact said dielectric layer, said second conductive layer forming a second capacitor plate.

2. The method as specified in claim 1, further comprising defining said opening by patterning photoresist prior to said etching of said opening.

3. The method as specified in claim 1, wherein said etching said first etch type layer forms at least one corrugation in said sidewalls.

4. A method for forming a plurality of capacitors in a semiconductor device comprising the following steps:

a) depositing an etch stop layer to overlie previously fabricated structures and a substrate of said semiconductor device;

b) depositing at least one insulative layer to overlie said etch stop and to fill in depressions between said previously fabricated structures;

c) planarizing said insulative layer to provide a planar surface for conformal depositions;

d) alternately depositing at least a conformal first etch type layer and a conformal second etch type layer overlying said insulative layer, said first etch type layer capable of being substantially more consumed during an etch than said second etch type layer and said insulative layer;

e) defining self-aligned openings by masking said first and second etch type layers with a patterned photoresist;

f) etching said insulative layer and said first and second etch type layers in order to form said openings and expose said etch stop overlying at least a portion of a contact area of said substrate in each of said openings, said openings having sidewalls of said insulative layer and said first and second etch type layers, said sidewalls being substantially normal to a top surface of said substrate;

g) etching a portion of said first etch type layer while substantially retaining said second etch type layer and said insulative layer, said etching forming corrugations in said sidewalls;

h) etching said etch stop in order to expose said contact area;

i) blanket depositing a first capacitive layer to contact said first and second etch type layers and said insulative layer and said contact area;

j) masking sad first capacitive layer, said masking defining a plurality of capacitor areas;

k) etching said first capacitive layer to separate said first capacitive layer into individual first capacitor plates for each capacitor of said plurality;

l) blanket depositing a dielectric layer to overlie at least said individual first capacitor plates; and m) blanket depositing a second capacitive layer to overlie said dielectric layer, said second capacitive layer forming a second capacitor plate of each capacitor of each plurality, said second capacitor plate of each capacitor of said plurality being in electrical communication one with another.

5. The method as specified in claim 4, wherein said etch stop layer is selected from the group of materials comprising aluminum oxide, aluminum nitride, silicon carbide, barium oxide, and ceramics.

6. The method as specified in claim 4, wherein said planarizing further comprises a chemical mechanical planarizing.

7. The method as specified in claim 4, wherein said first and second etch type layers are dielectrics.

8. The method as specified in claim 4, wherein said etching said first etch type layer further comprises isotropically etching said first layer.

9. The method as specified in claim 4, wherein said etching of said etch type layer further comprises dry etching said etch stop utilizing a mixture of $BCl_3$ and $Cl_2$.

10. The method as specified in claim 9, wherein said etching of said etch stop layer further comprises wet etching with hot $H_3PO_4$.

11. The method as specified in claim 4, wherein said etching of said insulative layer and said first and second etch type layers further comprises anisotropic etching of said insulative layer and said first and second etch type layers.

* * * * *